(12) United States Patent
Varghese

(10) Patent No.: US 7,288,476 B2
(45) Date of Patent: Oct. 30, 2007

(54) CONTROLLED DRY ETCH OF A FILM

(75) Inventor: Ronnie P. Varghese, Westminster, CO (US)

(73) Assignee: Avago Technologies General IP Pte. Ltd., Singapore (SG)

( * ) Notice: Subject to any disclaimer, the term of this patent is extended or adjusted under 35 U.S.C. 154(b) by 0 days.

(21) Appl. No.: 11/044,393

(22) Filed: Jan. 26, 2005

(65) Prior Publication Data

US 2005/0130409 A1   Jun. 16, 2005

Related U.S. Application Data

(62) Division of application No. 10/633,149, filed on Jul. 31, 2003, now abandoned.

(51) Int. Cl.
*H01L 21/4763* (2006.01)
*H01L 21/311* (2006.01)

(52) U.S. Cl. .................. 438/634; 438/694; 438/942; 438/946; 438/950

(58) Field of Classification Search .............. 438/16, 438/623, 624, 634, 638, 639, 694, 942, 946, 438/950; 356/445; 257/296
See application file for complete search history.

(56) References Cited

U.S. PATENT DOCUMENTS

| 4,791,073 | A | * | 12/1988 | Nagy et al. ................. 438/435 |
| 5,651,855 | A | | 7/1997 | Dennison et al. |
| 6,140,206 | A | | 10/2000 | Li et al. |
| 6,228,277 | B1 | * | 5/2001 | Kornblit et al. .............. 216/60 |
| 6,583,047 | B2 | * | 6/2003 | Daniels et al. .............. 438/623 |
| 6,903,401 | B2 | * | 6/2005 | Lowrey ..................... 257/296 |
| 6,934,032 | B1 | * | 8/2005 | Subramanian et al. ...... 356/445 |
| 6,973,712 | B2 | * | 12/2005 | Chen et al. .............. 29/603.14 |
| 2002/0106887 | A1 | | 8/2002 | Chang |

FOREIGN PATENT DOCUMENTS

EP        0316550        5/1989

* cited by examiner

*Primary Examiner*—Ngân V. Ngô

(57) ABSTRACT

The controlled etch into a substrate or thick homogeneous film is accomplished by introducing a sacrificial film to gauge the depth to which the substrate/thick film has been etched. Optical endpointing the etch of the sacrificial film on the etch stop layer allows another element of process control over the depth of the primary trench or via.

11 Claims, 6 Drawing Sheets

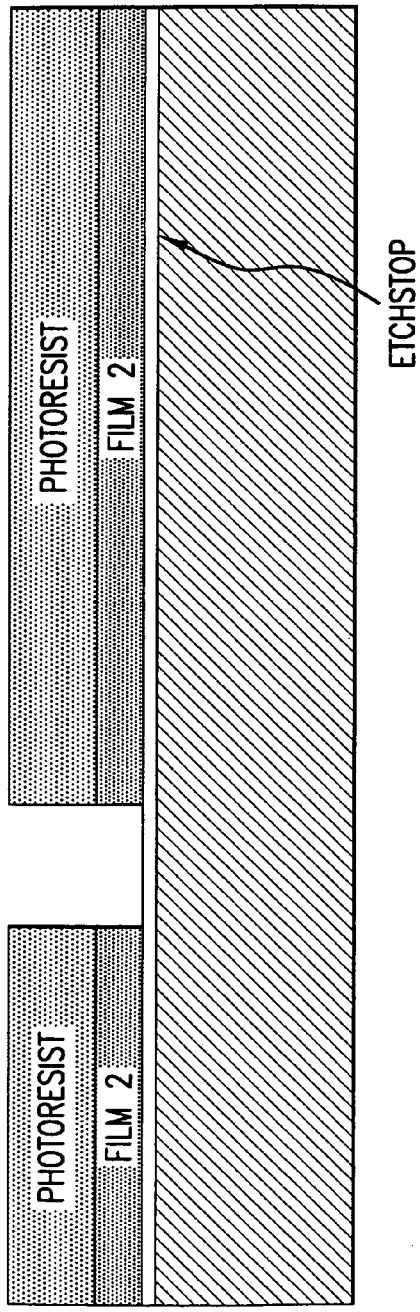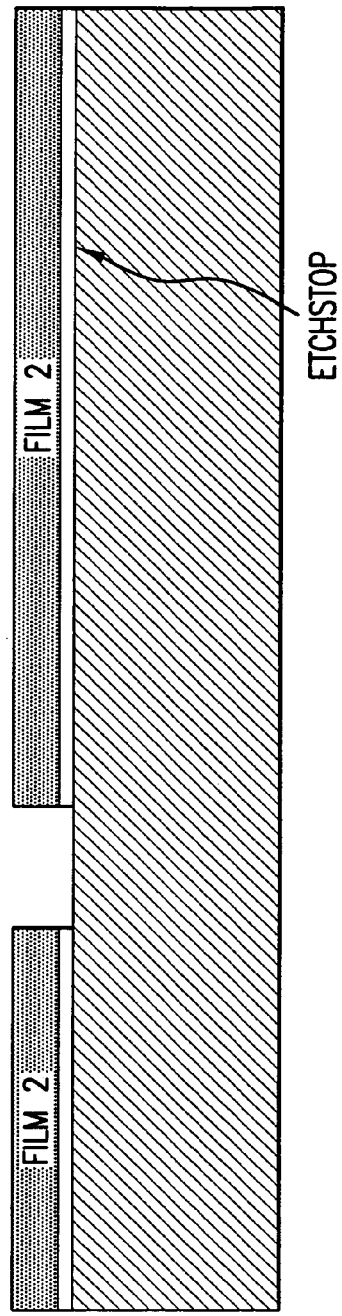
FIG.2C
FIG.2D

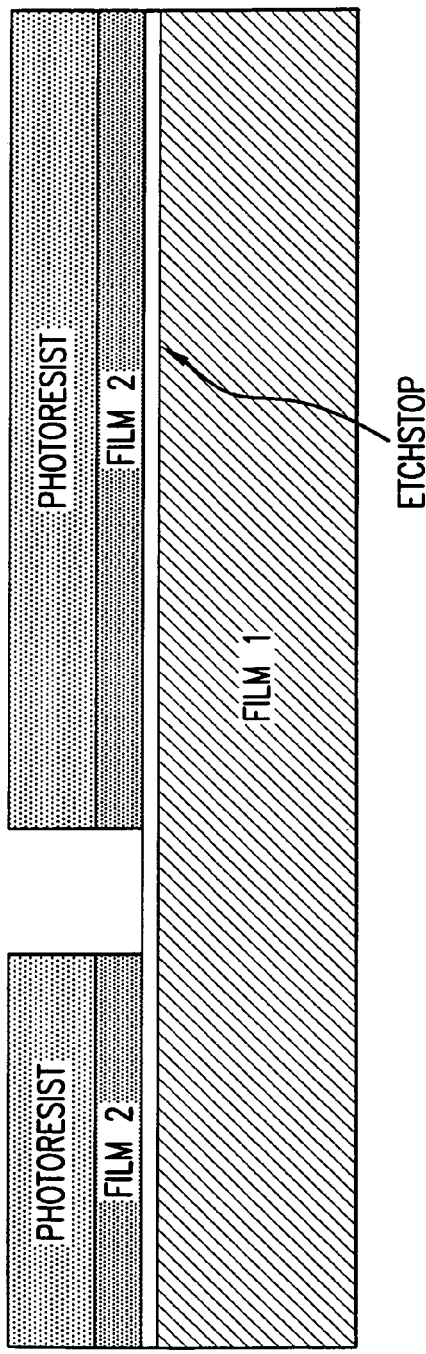
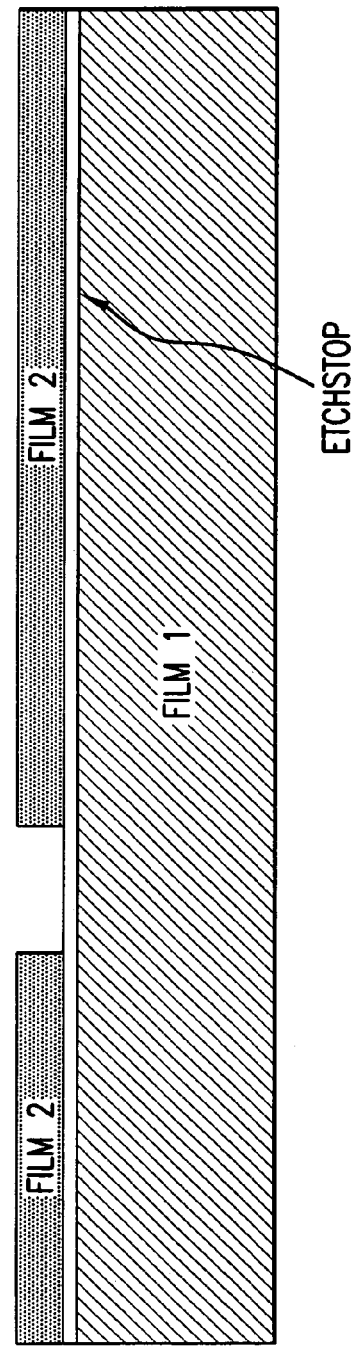
FIG.2F
FIG.2G

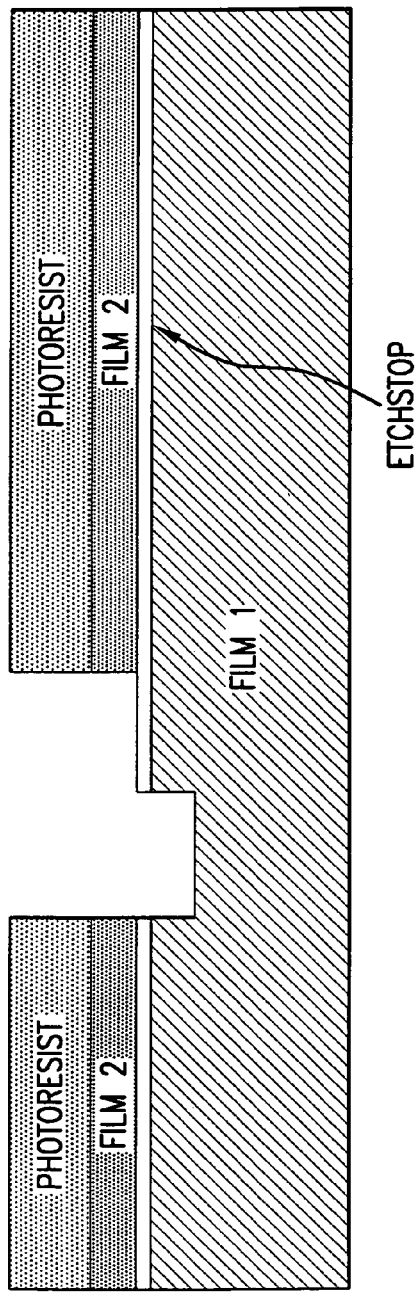
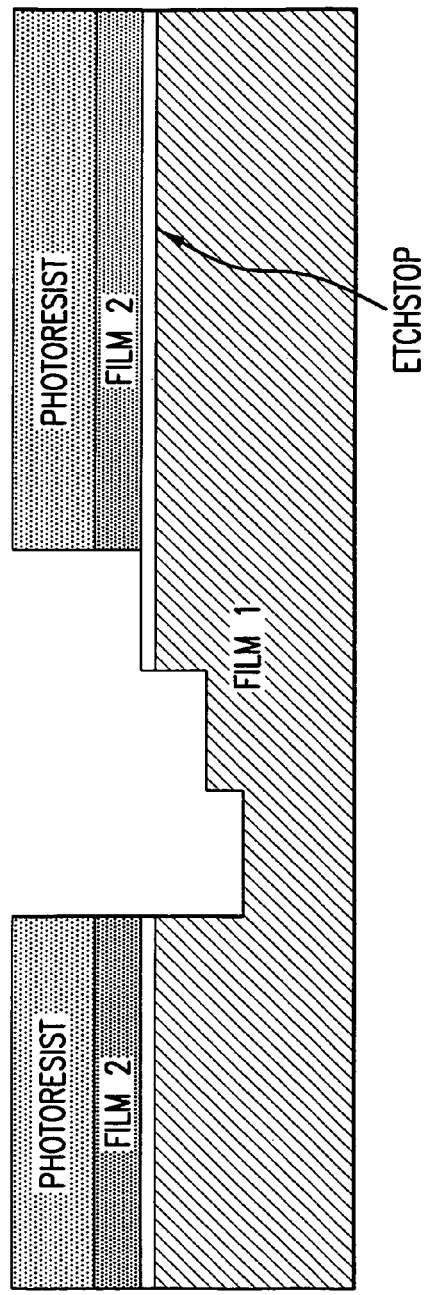
FIG.2H
FIG.2I

CONTROLLED DRY ETCH OF A FILM

This is a Divisional of application Ser. No.10/633,149, filed on Jul. 31, 2003, now abandoned the entire disclosure of which is incorporated herein by reference.

BACKGROUND

One prior art technique for controlling the etching depth into a film requires embedding etch stop layers at the required trench depth. The etching solution etches the film at a higher rate than the etch stop layer allowing finer control of the depth. While this works acceptably for multiple films deposited on a substrate, e.g. dual damascene process in CMOS technology, it is not practical for etching into a substrate or a very thick homogeneous film.

Another prior art technique, typically used in microelectromechanical system (MEMS) applications, is to use a silicon-on-insulator (SOI) wafer. The etch stop layers are embedded into the insulator layer. This restricts the manufacturing process to layered silicon-insulator-silicon substrates. Adding etch stop layers into the insulator layer is costly and adds to their manufacturing process complexity.

With both techniques, the embedded etch stop layers can interfere with the morphology and the growth phase of the device film.

SUMMARY

The controlled etch into a substrate or thick homogeneous film is accomplished by introducing a sacrificial film to gauge the depth to which the substrate/thick film has been etched. Optical endpointing the etch of the sacrificial film on the etch stop layer allows another element of process control over the depth of the primary trench or via.

An etch stop insulator film is deposited on a first film, e.g. c-Si substrate. A second film, e.g. amorphous Si layer, epitaxial Si, or a sacrificial film is deposited over the etch stop film. The second film is controllably patterned using a C12 based etch chemistry or adequate wet etch chemistry. The etch stop film is then removed using either wet or dry etch chemistry that is highly selective to both the first and second films. The mask is then stripped and then the principal trench is etched into the first film using the second film to terminate etch.

BRIEF DESCRIPTION OF THE DRAWINGS

FIGS. 2A–2I illustrates the process flowchart shown in FIG. 1.

DETAILED DESCRIPTION

Unlike the prior art, in the present invention, since the substrate/thick film to be etched does not require embedded etch stop layers, there is reduced manufacturing process complexity.

The etch of the film can be precisely controlled by conventional endpointing techniques, e.g. optical emission spectra or interferometry. The endpoint system can be tuned to detect when the etch reaches the etch stop. A timed etch approach may also be employed but will have lesser process control.

The present invention allows devices that require stepped trenches in a film or substrate, e.g. diffractive optical elements, a greater variety of starting materials.

The trench depth into first film can be defined by changing the thickness of second film.

Figure 1:
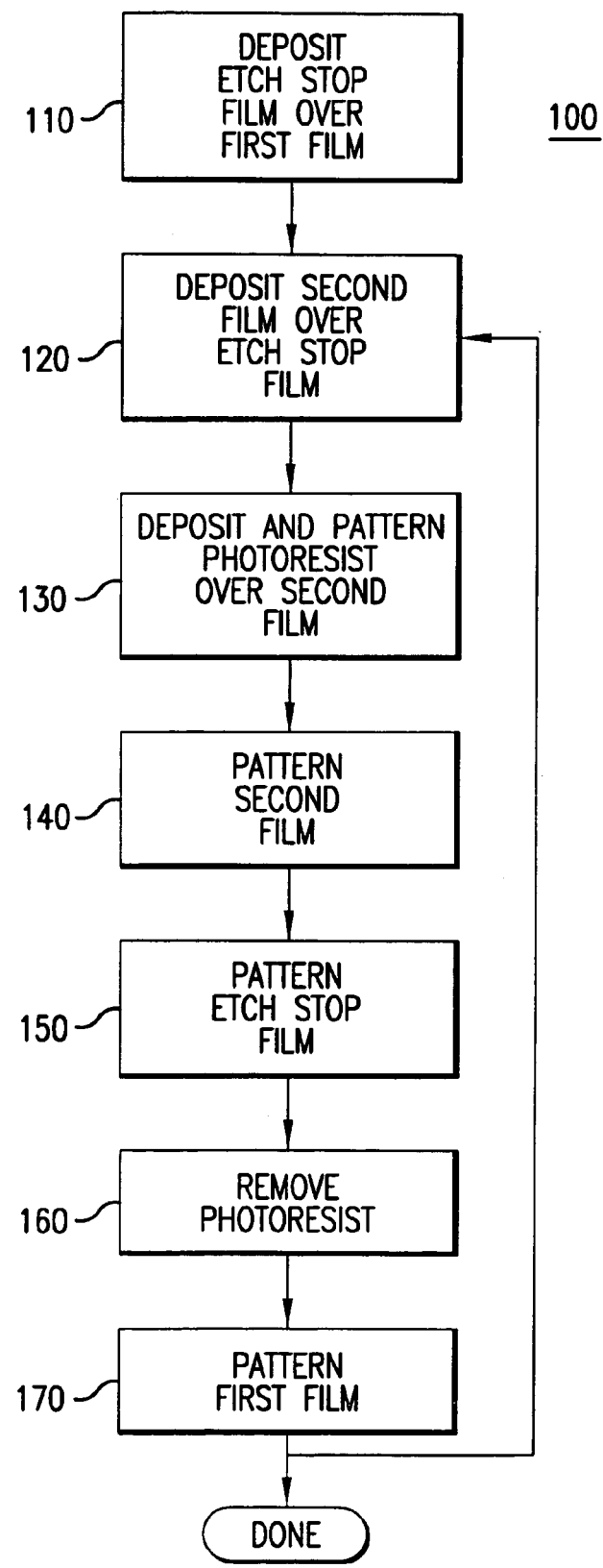
FIG. 1 is a process flowchart according to the present invention.

FIG. 1 outlines a process flowchart corresponding to the present invention. FIG. 2A–I illustrate the process flowchart shown in FIG. 1.

Figure 2A:
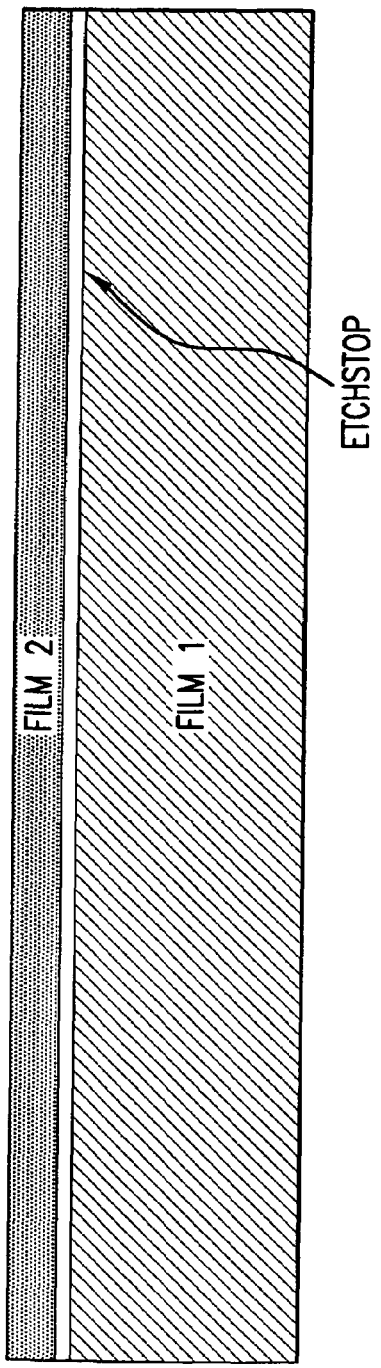
Figure 2B:
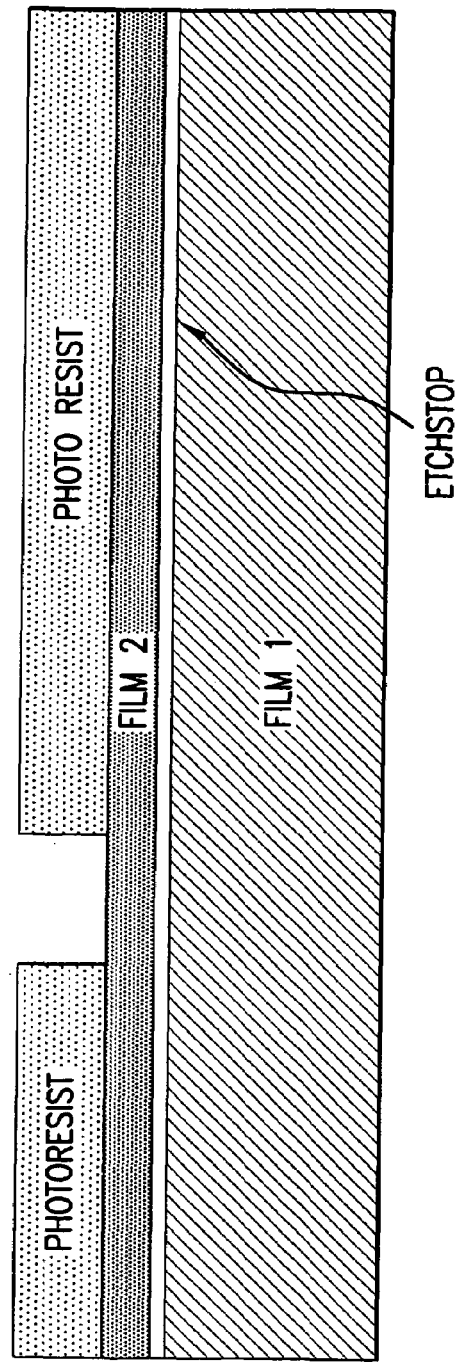
Figure 2E:
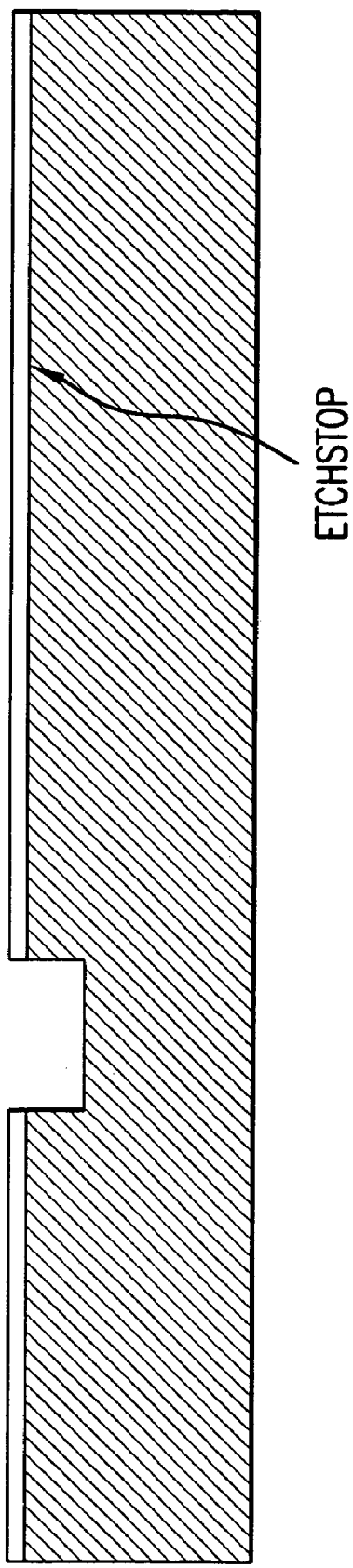

In step 110, an etch stop film, e.g. an oxide, is deposited on a first film. In step 120, a second film is deposited over the etch stop film. Steps 110 and 120 are shown in FIG. 2A. In step 130, a photo-mask layer, e.g. Ash, is applied over the second film (FIG. 2B). In step 140, the second film is controllably patterned using a C12 based or any suitable dry or wet etch chemistry (shown in FIG. 2C). In step 150, the etch stop film is patterned using either wet or dry etch chemistry. In step 160, the photo-mask is stripped (shown in FIG. 2D). In step 170, a principal trench is etched into the first film using the second film to terminate etch (shown in FIG. 2E). The trench etch depth is determined by the relative etch ratio of second film to the first film and the time to etch the second film over the etch stop film. The process can be repeated from step 130 until the desired stepped trenches are created (shown in FIGS. 2F–I).

A non-iterative processing can be used for Shallow Trench Isolation schemes used in CMOS processes. To create stepped or multi-level trenches, a similar but iterative process with a 'delayed' principal trench etch sequence (i.e. the $1^{st}$ principal trench etch does not occur immediately after the $1^{st}$ sacrificial+ etch stop etches but as a consequence of the $2^{nd}$ sacrificial etch) is utilized. In the event that the trench depth has to be changed, the new depth can be defined by changing the thickness of the sacrificial film. By doing so, the substrate specifications as defined with the Silicon wafer vendor can be left unaltered.

In one embodiment using the process outlined in FIG. 1, the first film is a c-Si substrate while the second film may be an amorphous Si layer or any other available film, which etches in the same process chemistry as the substrate.

In another embodiment, the first layer is low-k dielectric, where k is typically between 1 and 3.9, and the second layer is a amorphous silicon.

In another embodiment, a silicon on insulator (SOI) wafer can be purchased from a vendor with the appropriate sacrificial epitaxial Silicon and etch stop insulator layer over the c-Si substrate. Hence, the first film is a c-Si substrate while the second film is the sacrificial epitaxial Si layer. However, any changes to the substrate trench depth will require retargeting the epitaxial Silicon layer thickness leading to an elevation in wafer or substrate cost.

In another embodiment, an etch stop film is deposited on a thick film that has been already deposited on a device wafer or substrate. A sacrificial film, which etches in the same process chemistry as the thick film, is deposited over the etch stop film. The first film corresponds to the thick film, e.g. an inter-level dielectric, while the second film corresponds to the sacrificial film. When the trench depth has to be changed, the new depth can be defined by changing the thickness of the sacrificial film.

The present invention simplifies the processing of diffractive optical elements or other process or device schemes that require stepped trenches in a film or substrate.

It will be obvious to one skilled in the art that a multiple layer etching structure can be created by layer etch stop films and amorphous Si.

The invention claimed is:

1. A method for generating a first trench comprising:
   depositing an etch stop film over a first layer, wherein the first layer is a c-Si substrate;
   depositing a second layer over the etch stop film;
   depositing a first photomask layer over the second layer;
   patterning the first photomask layer;
   patterning the second layer according to the first photomask layer;
   patterning the etch stop layer;
   removing the first photomask layer; and
   patterning the first layer according to the etch stop layer, wherein the second layer terminates the etch, and wherein a depth of the first layer is determined by a relative etch ratio of the second layer to the first layer and the time to etch the second layer over the etch stop film.

2. A method, as defined in claim 1, wherein the etch stop film is an oxide.

3. A method, as defined in claim 1, wherein the first layer is a c-Si substrate and the second layer is amorphous silicon.

4. A method, as defined in claim 3, wherein patterning the amorphous silicon includes etching with chlorine based etch chemistry.

5. A method, as defined in claim 3, wherein the first layer is a c-Si substrate and the second layer is epitaxial silicon.

6. A method, as defined in claim 1, wherein patterning the etch stop layer includes patterning with wet etch chemistry.

7. A method, as defined in claim 1, wherein patterning the etch stop layer includes patterning with dry etch chemistry.

8. A method, as defined in claim 1, wherein patterning the amorphous silicon includes optical endpointing to determine when the etch reaches the etch stop.

9. A method, as defined in claim 8, wherein optical endpointing includes applying optical emission spectra.

10. A method, as defined in claim 8, wherein optical endpointing includes applying interferometry.

11. A method, as defined in claim 1, further comprising:
    depositing a second photomask layer;
    patterning the second photomask layer;
    patterning the second layer according to the second photomask layer; and
    etching the first layer according to the etch stop layer to define an additional trench, wherein the additional trench has a shallower depth than the first trench.

* * * * *